(12) United States Patent
Allen

(10) Patent No.: US 10,333,495 B2
(45) Date of Patent: Jun. 25, 2019

(54) COMPENSATED PROGRAMMABLE RF ATTENUATOR

(71) Applicant: Qorvo US, Inc., Greensboro, NC (US)

(72) Inventor: Donald L. Allen, Richardson, TX (US)

(73) Assignee: Qorvo US, Inc., Greensboro, NC (US)

( * ) Notice: Subject to any disclaimer, the term of this patent is extended or adjusted under 35 U.S.C. 154(b) by 333 days.

(21) Appl. No.: 15/206,832

(22) Filed: Jul. 11, 2016

(65) Prior Publication Data

US 2017/0012606 A1 Jan. 12, 2017

Related U.S. Application Data

(60) Provisional application No. 62/190,811, filed on Jul. 10, 2015.

(51) Int. Cl.
*H03H 11/24* (2006.01)
*H03H 7/25* (2006.01)

(52) U.S. Cl.
CPC ............ *H03H 11/245* (2013.01); *H03H 7/25* (2013.01)

(58) Field of Classification Search
CPC .............................. H03H 11/245; H03H 7/25
USPC .................................. 327/308–330; 333/81 R
See application file for complete search history.

(56) References Cited

U.S. PATENT DOCUMENTS

| 5,912,599 A * | 6/1999 | Beall ................... H03H 11/245 327/308 |
| 2006/0279376 A1* | 12/2006 | Ehlers .................. H03H 11/245 333/81 R |

OTHER PUBLICATIONS

Bayruns, J. et al., "A Monolithic DC-1.6GHz Digital Attenuator," 1989 IEEE MTT-S Digest, QQ-3, 1989, IEEE, pp. 1295-1298.

Dai, Yong-Sheng et al., "An Ultra Broadband 2-18GHz 6-Bit PHEMT MMIC Digital Attenuator with Low Insertion Phase Shift," Proceedings of 2010 IEEE International Conference on Ultra-Wideband (ICUWB2010), Sep. 2010, IEEE, 3 pages.

Khabbaz, Brian et al., "DC-to-20-GHz MMIC Multibit Digital Attenuators with On-Chip TTL Control," IEEE Journal of Solid-State Circuits, vol. 27, No. 10, Oct. 1992, pp. 1457-1462.

Krafcsik, Dave et al., "Broadband, Low-Loss 5- and 6-Bit Digital Attenuators," 1995 MTT-S Digest, TH4E-3, 1995, IEEE, pp. 1627-1630.

(Continued)

*Primary Examiner* — Tomi Skibinski
(74) *Attorney, Agent, or Firm* — Withrow & Terranova, P.L.L.C.

(57) ABSTRACT

A programmable RF attenuator having a first connection node and a second connection node is disclosed. The programmable RF attenuator provides RF attenuation between the first connection node and the second connection node based on at least a first attenuation control signal. The programmable RF attenuator includes a first RF attenuator circuit and a first reactance compensation circuit, such that the first RF attenuator circuit includes a first shunt transistor element and a first shunt resistive element, which is coupled to the first shunt transistor element. The first shunt transistor element receives the first attenuation control signal. The first reactance compensation circuit is coupled to the first RF attenuator circuit and at least partially compensates for reactive characteristics of the programmable RF attenuator that affect an attenuation flatness of the programmable RF attenuator.

19 Claims, 13 Drawing Sheets

(56) References Cited

OTHER PUBLICATIONS

Liu, Chengpeng et al., "X-Band 5-bit MMIC Digital Attenuator with Low Phase Shift," TELKOMNIKA Indonesian Journal of Electrical Engineering, vol. 12, No. 6, Jun. 2014, pp. 4184-4189.
Sarkissian, J.C. et al., "A KU-Band 6-BIT Digital Attenuator With Integrated Serial to Parallel Converter," 1999 MTT-S Digest, vol. 4, 1999, IEEE, 4 pages.

* cited by examiner

COMPENSATED PROGRAMMABLE RF ATTENUATOR

RELATED APPLICATIONS

This application claims the benefit of provisional patent application No. 62/190,811, filed Jul. 10, 2015, the disclosure of which is hereby incorporated herein by reference in its entirety.

FIELD OF THE DISCLOSURE

Embodiments of the present disclosure relate to radio frequency (RF) circuitry, which may include programmable RF attenuators, RF control circuitry, RF front-end circuitry, RF transceiver circuitry, RF amplifiers, RF filters, RF antennas, RF switches, RF combiners, RF splitters, the like, or any combination thereof.

BACKGROUND

Programmable RF attenuators may be often used in RF circuitry to attenuate RF signals to desired levels. Ideally, such an RF attenuator would have a flat frequency response across an operating frequency range of the RF attenuator, such that a selected attenuation of the RF attenuator would not change as an operating frequency of the RF attenuator changes. However, reactive characteristics of the RF attenuator may cause undesired attenuation characteristics across the operating frequency range of the RF attenuator. Thus, there is a need for a programmable RF attenuator that can mitigate undesired attenuation characteristics across an operating frequency range of the programmable RF attenuator.

SUMMARY

A programmable RF attenuator having a first connection node and a second connection node is disclosed according to one embodiment of the present disclosure. The programmable RF attenuator provides RF attenuation between the first connection node and the second connection node based on at least a first attenuation control signal. The programmable RF attenuator includes a first RF attenuator circuit and a first reactance compensation circuit, such that the first RF attenuator circuit includes a first shunt transistor element and a first shunt resistive element, which is coupled to the first shunt transistor element. The first shunt transistor element receives the first attenuation control signal. The first reactance compensation circuit is coupled to the first RF attenuator circuit and at least partially compensates for reactive characteristics of the programmable RF attenuator that affect an attenuation flatness of the programmable RF attenuator.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
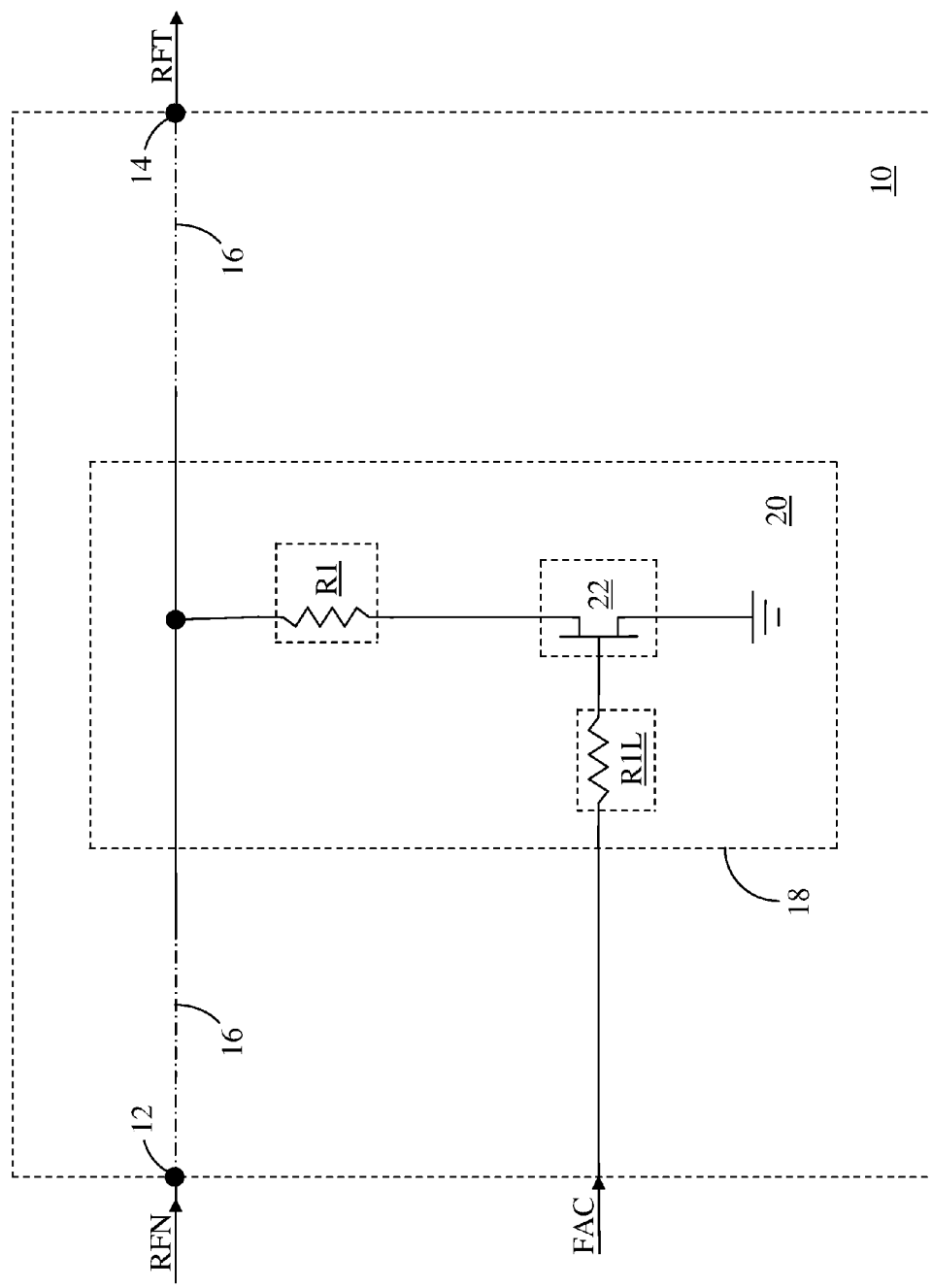
FIG. 1 shows details of a programmable RF attenuator according to one embodiment of the programmable RF attenuator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

A programmable RF attenuator having a first connection node and a second connection node is disclosed according to one embodiment of the present disclosure. The programmable RF attenuator provides RF attenuation between the first connection node and the second connection node based on at least a first attenuation control signal. The programmable RF attenuator includes a first RF attenuator circuit and a first reactance compensation circuit, such that the first RF attenuator circuit includes a first shunt transistor element and a first shunt resistive element, which is coupled to the first shunt transistor element. The first shunt transistor element receives the first attenuation control signal. The first reactance compensation circuit is coupled to the first RF attenuator circuit and at least partially compensates for reactive characteristics of the programmable RF attenuator that affect an attenuation flatness of the programmable RF attenuator.

FIG. 1 shows details of a programmable RF attenuator 10 according to one embodiment of the programmable RF attenuator 10. The programmable RF attenuator 10 has a first connection node 12, a second connection node 14, and a signal path 16 between the first connection node 12 and the second connection node 14. The programmable RF attenuator 10 includes a first RF attenuator circuit 18, which includes a shunt attenuator circuit 20 according to one embodiment of the programmable RF attenuator 10. In one embodiment of the programmable RF attenuator 10, the programmable RF attenuator 10 provides RF attenuation between the first connection node 12 and the second connection node 14 based on at least a first attenuation control signal FAC.

The shunt attenuator circuit 20 includes a first shunt transistor element 22, a first shunt resistive element R1, and a first control resistive element R1L. The first shunt resistive element R1 is coupled to the first shunt transistor element 22. In one embodiment of the shunt attenuator circuit 20, the first shunt resistive element R1 and the first shunt transistor element 22 are coupled in series between the signal path 16 and a ground. The first control resistive element R1L is coupled to a control input to the first shunt transistor element 22. The first shunt transistor element 22 receives a first attenuation control signal FAC via the first control resistive element R1L. In one embodiment of the first shunt transistor element 22, the first shunt transistor element 22 operates in one of an OFF state and an ON state based on the first attenuation control signal FAC. In an alternate embodiment of the shunt attenuator circuit 20, the first control resistive element R1L is omitted, such that the first shunt transistor element 22 receives the first attenuation control signal FAC directly.

In one embodiment of the programmable RF attenuator 10, when the first shunt transistor element 22 operates in the ON state, the shunt attenuator circuit 20 provides at least a portion of the RF attenuation between the first connection node 12 and the second connection node 14. In one embodiment of the programmable RF attenuator 10, when the first shunt transistor element 22 operates in the OFF state, the shunt attenuator circuit 20 provides no significant RF attenuation between the first connection node 12 and the second connection node 14.

In one embodiment of the programmable RF attenuator 10, the programmable RF attenuator 10 provides variable attenuation, such that the first shunt transistor element 22 operates within a first analog operating region. As such, the first attenuation control signal FAC is an analog control signal, which selects an operating point in the first analog operating region. Therefore, the first shunt transistor element 22 and the first shunt resistive element R1 provide at least a portion of the RF attenuation of the programmable RF attenuator 10. In one embodiment of the programmable RF attenuator 10, the programmable RF attenuator 10 receives an RF input signal RFN via the first connection node 12 and provides an RF output signal RFT via the second connection node 14 based on the RF input signal RFN and the RF attenuation.

In a first embodiment of the RF input signal RFN, a frequency of the RF input signal RFN is between 10 Megahertz and 40 Gigahertz. In a second embodiment of the RF input signal RFN, the frequency of the RF input signal RFN is between 10 Megahertz and 50 Gigahertz. In a third embodiment of the RF input signal RFN, the frequency of the RF input signal RFN is between 10 Megahertz and 100 Gigahertz. In a fourth embodiment of the RF input signal RFN, the frequency of the RF input signal RFN is between 1 Megahertz and 50 Gigahertz. In a fifth embodiment of the RF input signal RFN, the frequency of the RF input signal RFN is between 10 kilohertz and 100 Gigahertz.

In one embodiment of the first shunt transistor element 22, the first shunt transistor element 22 is a bipolar junction transistor (BJT) element, such that the control input to the first shunt transistor element 22 is a base. In an alternate embodiment of the first shunt transistor element 22, the first shunt transistor element 22 is a field effect transistor (FET) element, such that the control input to the first shunt transistor element 22 is a gate. In another embodiment of the first shunt transistor element 22, the first shunt transistor element 22 is any type of transistor element.

Figure 2:
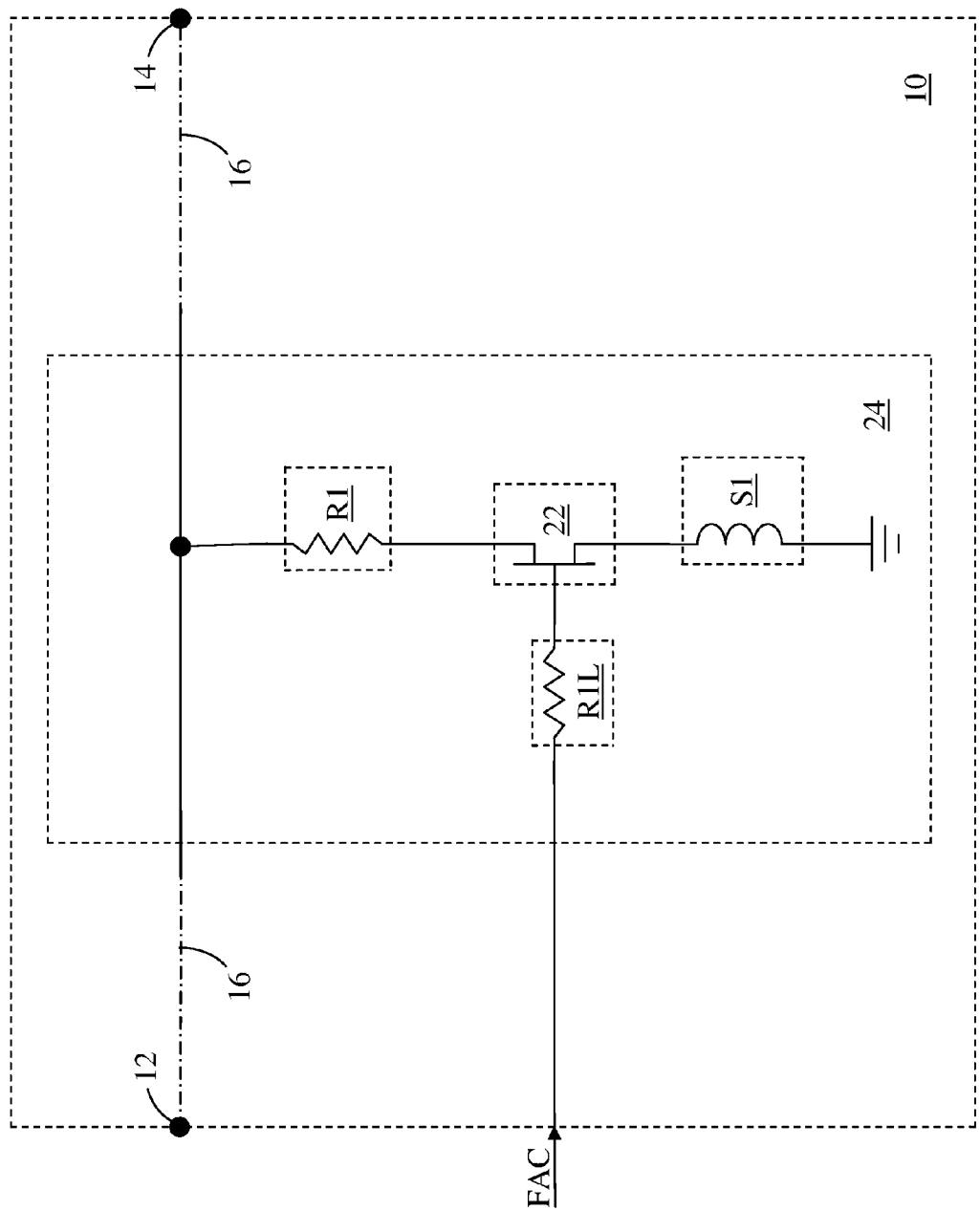
FIG. 2 shows details of the programmable RF attenuator according to an alternate embodiment of the programmable RF attenuator.

FIG. 2 shows details of the programmable RF attenuator 10 according to an alternate embodiment of the programmable RF attenuator 10. The programmable RF attenuator 10 illustrated in FIG. 2 includes a shunt attenuator circuit model 24 of the shunt attenuator circuit 20 illustrated in FIG. 1. The shunt attenuator circuit model 24 includes the first shunt transistor element 22, the first shunt resistive element R1, the first control resistive element R1L, and further includes a first effective shunt inductance S1. In the shunt attenuator circuit model 24, the first shunt transistor element 22, the first shunt resistive element R1, and the first effective shunt inductance S1 are coupled in series between the signal path 16 and the ground. The first effective shunt inductance S1 may contribute to reactive characteristics of the programmable RF attenuator 10.

In one embodiment of the shunt attenuator circuit 20, the first effective shunt inductance S1 is based on any or all electrically conductive paths through the shunt attenuator circuit 20, such as circuit traces, via connections, component leads, wires, internal component connections, the like, or any combination thereof.

Figure 3:
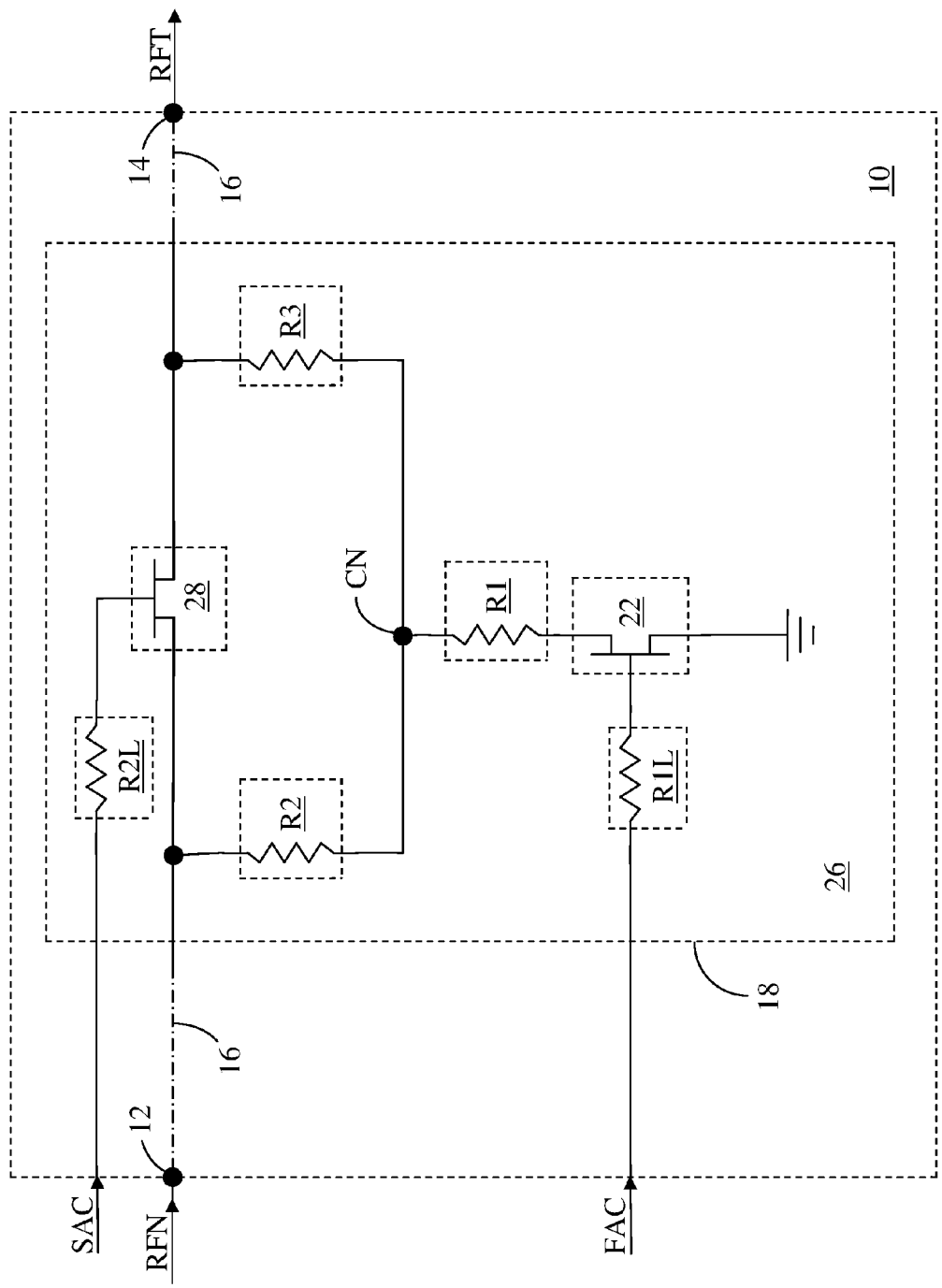
FIG. 3 shows details of the programmable RF attenuator according to an additional embodiment of the programmable RF attenuator.

FIG. 3 shows details of the programmable RF attenuator 10 according to an additional embodiment of the programmable RF attenuator 10. The programmable RF attenuator 10 illustrated in FIG. 3 is similar to the programmable RF attenuator 10 illustrated in FIG. 1, except in the programmable RF attenuator 10 illustrated in FIG. 3, the first RF attenuator circuit 18 includes a Tee attenuator circuit 26 instead of the shunt attenuator circuit 20. In one embodiment of the programmable RF attenuator 10, the programmable RF attenuator 10 provides RF attenuation between the first connection node 12 and the second connection node 14 based on at least one of the first attenuation control signal FAC and a second attenuation control signal SAC.

The Tee attenuator circuit 26 includes the first shunt transistor element 22, the first shunt resistive element R1, the first control resistive element R1L, a second shunt resistive element R2, a third shunt resistive element R3, a first series transistor element 28, and a second control resistive element R2L. The first series transistor element 28 is coupled in series in the signal path 16 between the first connection node 12 and the second connection node 14.

In one embodiment of the shunt attenuator circuit 20, the first shunt resistive element R1 and the first shunt transistor element 22 are coupled in series between a connection node CN and a ground. The second shunt resistive element R2 is coupled between the connection node CN and a first current-carrying terminal of the first series transistor element 28. The third shunt resistive element R3 is coupled between the connection node CN and a second current-carrying terminal of the first series transistor element 28. In this regard, the first current-carrying terminal of the first series transistor element 28 is coupled to the first connection node 12 via the signal path 16. The second current-carrying terminal of the first series transistor element 28 is coupled to the second connection node 14 via the signal path 16.

In general, the second shunt resistive element R2 is coupled between the first shunt resistive element R1 and the first current-carrying terminal of the first series transistor element 28. The third shunt resistive element R3 is coupled between the first shunt resistive element R1 and the second current-carrying terminal of the first series transistor element 28.

The first control resistive element R1L is coupled to the control input to the first shunt transistor element 22. The second control resistive element R2L is coupled to a control input to the first series transistor element 28. The first shunt transistor element 22 receives the first attenuation control signal FAC via the first control resistive element R1L. The first series transistor element 28 receives the second attenuation control signal SAC via the second control resistive element R2L.

In one embodiment of the first shunt transistor element 22, the first shunt transistor element 22 operates in one of the OFF state and the ON state based on the first attenuation control signal FAC. In an alternate embodiment of the Tee attenuator circuit 26, the first control resistive element R1L is omitted, such that the first shunt transistor element 22 receives the first attenuation control signal FAC directly.

In one embodiment of the first series transistor element 28, the first series transistor element 28 operates in one of an OFF state and an ON state based on the second attenuation control signal SAC. In another embodiment of the Tee attenuator circuit 26, the second control resistive element R2L is omitted, such that the first series transistor element 28 receives the second attenuation control signal SAC directly.

In one embodiment of the programmable RF attenuator 10, when the first shunt transistor element 22 operates in the ON state, the first series transistor element 28 operates in the OFF state, such that the Tee attenuator circuit 26 provides at least a portion of the RF attenuation between the first connection node 12 and the second connection node 14. Specifically, the first shunt resistive element R1 provides at least a portion of the RF attenuation between the first connection node 12 and the second connection node 14.

In one embodiment of the programmable RF attenuator 10, when the first shunt transistor element 22 operates in the OFF state, the first series transistor element 28 operates in the ON state, such that the Tee attenuator circuit 26 contributes no significant RF attenuation between the first connection node 12 and the second connection node 14.

In one embodiment of the programmable RF attenuator 10, the programmable RF attenuator 10 provides variable attenuation, such that the first shunt transistor element 22 operates within a first analog operating region and the first series transistor element 28 operates within a second analog operating region. As such, the first attenuation control signal FAC is an analog control signal, which selects an operating point in the first analog operating region; and the second attenuation control signal SAC is an analog control signal, which selects an operating point in the second analog operating region. Therefore, the first shunt transistor element 22, the first series transistor element 28, the first shunt resistive element R1, the second shunt resistive element R2, and the third shunt resistive element R3 provide at least a portion of the RF attenuation of the programmable RF attenuator 10. In one embodiment of the programmable RF attenuator 10, the programmable RF attenuator 10 receives the RF input signal RFN via the first connection node 12 and provides the RF output signal RFT via the second connection node 14 based on the RF input signal RFN and the RF attenuation.

In an alternate embodiment of the programmable RF attenuator 10, the second shunt resistive element R2, the third shunt resistive element R3, and the connection node CN are omitted, such that the first shunt resistive element R1 and the first shunt transistor element 22 are coupled in series between the first current-carrying terminal of the first series transistor element 28 and the ground. In a further embodiment of the programmable RF attenuator 10, the second shunt resistive element R2, the third shunt resistive element R3, and the connection node CN are omitted, such that the first shunt resistive element R1 and the first shunt transistor element 22 are coupled in series between the second current-carrying terminal of the first series transistor element 28 and the ground. Therefore, the first shunt transistor element 22, the first series transistor element 28, and the first shunt resistive element R1 provide at least a portion of the RF attenuation of the programmable RF attenuator 10.

In one embodiment of the first series transistor element 28, the first series transistor element 28 is a BJT element, such that the control input to the first series transistor element 28 is a base. In an alternate embodiment of the first series transistor element 28, the first series transistor element 28 is an FET element, such that the control input to the first series transistor element 28 is a gate. In another embodiment of the first series transistor element 28, the first series transistor element 28 is any type of transistor element.

Figure 4:
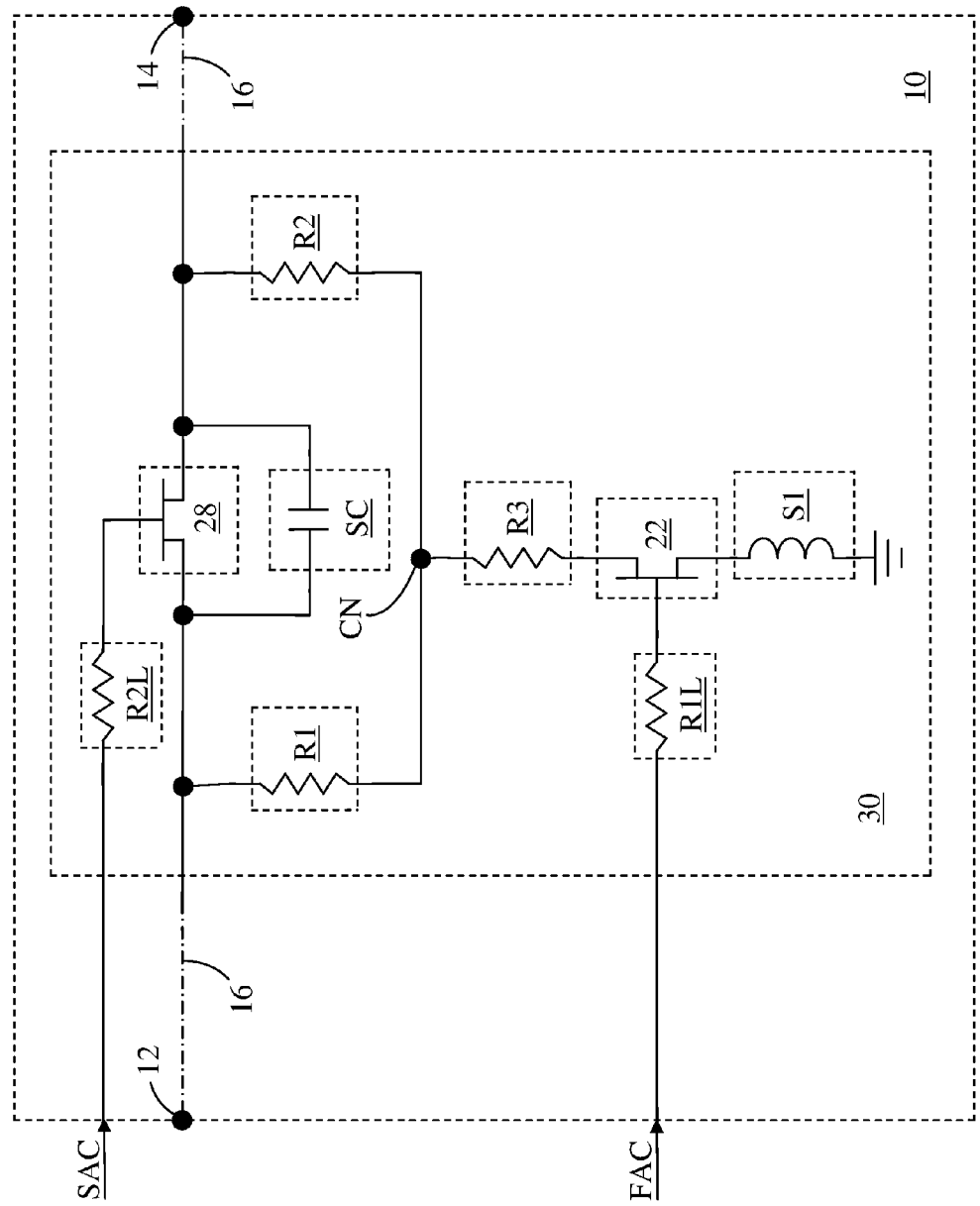
FIG. 4 shows details of the programmable RF attenuator according to another embodiment of the programmable RF attenuator.

FIG. 4 shows details of the programmable RF attenuator 10 according to another embodiment of the programmable RF attenuator 10. The programmable RF attenuator 10 illustrated in FIG. 4 includes a Tee attenuator circuit model 30 of the Tee attenuator circuit 26 illustrated in FIG. 3. The Tee attenuator circuit model 30 includes the first shunt transistor element 22, the first shunt resistive element R1, the first control resistive element R1L, the second shunt resistive element R2, the third shunt resistive element R3, first series transistor element 28, the second control resistive element R2L, and further includes a first effective shunt inductance S1 and an effective series capacitance SC.

In the Tee attenuator circuit model 30, the first shunt transistor element 22, the first shunt resistive element R1, and the first effective shunt inductance S1 are coupled in series between the connection node CN and the ground. The first effective shunt inductance S1, the effective series capacitance SC, or both may contribute to reactive characteristics of the programmable RF attenuator 10. In one embodiment of the Tee attenuator circuit 26 (FIG. 3), the first effective shunt inductance S1 is based on any or all electrically conductive paths through the Tee attenuator circuit 26 (FIG. 3), such as circuit traces, via connections, component leads, wires, internal component connections, the like, or any combination thereof. In one embodiment of the first series transistor element 28, the first series transistor element 28 provides the effective series capacitance SC across the first series transistor element 28 The effective series capacitance SC may be as a result of construction geometries of the first series transistor element 28 that may introduce one or mode parallel capacitances across the first series transistor element 28. The effective series capacitance SC may result in RF leakage across the first series transistor element 28 when the first series transistor element 28 is in an OFF state.

Figure 5:
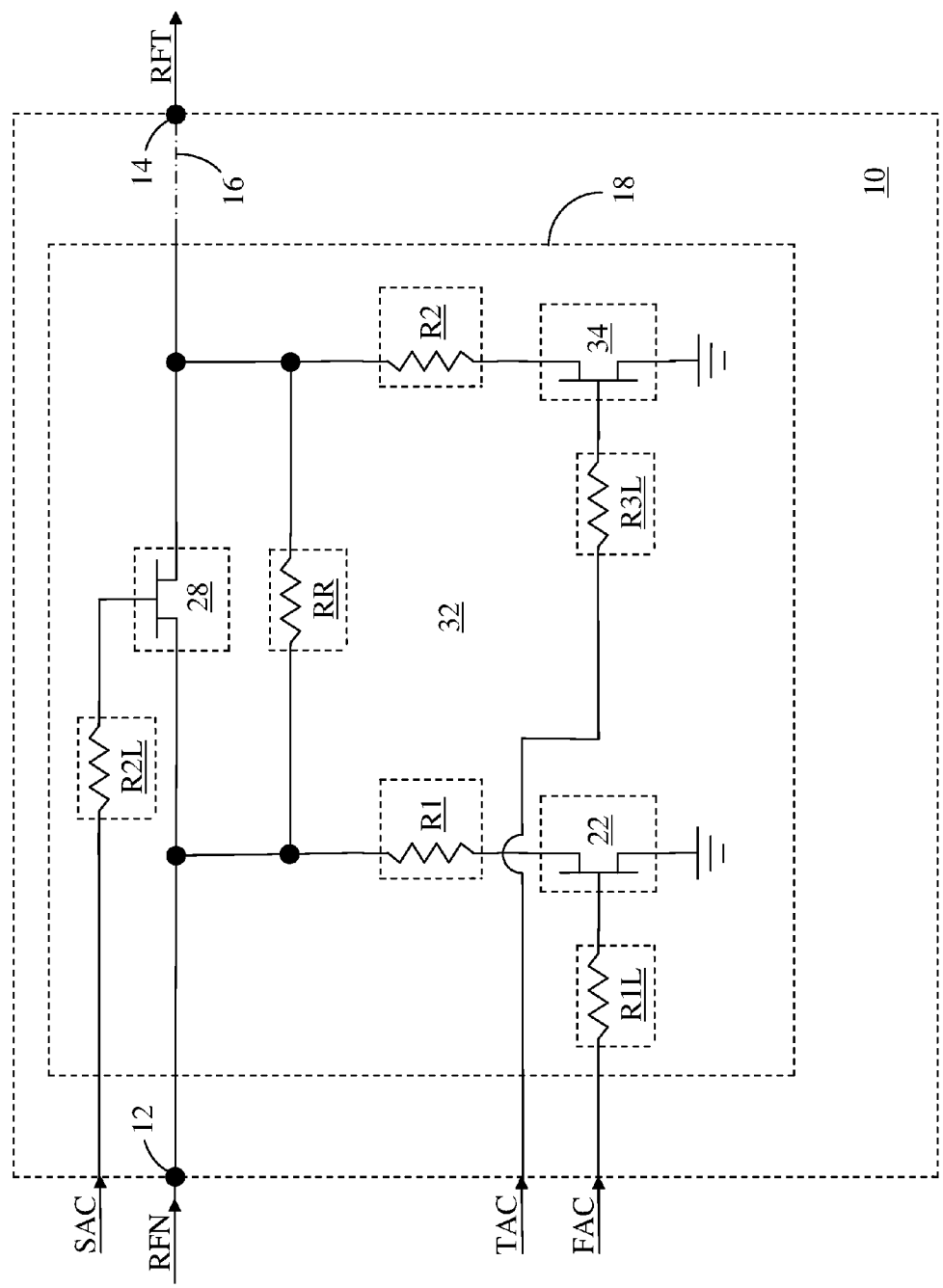
FIG. 5 shows details of the programmable RF attenuator according to a further embodiment of the programmable RF attenuator.

FIG. 5 shows details of the programmable RF attenuator 10 according to a further embodiment of the programmable RF attenuator 10. The programmable RF attenuator 10 illustrated in FIG. 5 is similar to the programmable RF attenuator 10 illustrated in FIG. 3, except in the programmable RF attenuator 10 illustrated in FIG. 5, the first RF attenuator circuit 18 includes a Pi attenuator circuit 32 instead of the Tee attenuator circuit 26. In one embodiment of the programmable RF attenuator 10, the programmable RF attenuator 10 provides RF attenuation between the first connection node 12 and the second connection node 14 based on at least one of the first attenuation control signal FAC, the second attenuation control signal SAC and a third attenuation control signal TAC.

The Pi attenuator circuit 32 includes the first shunt transistor element 22, the first shunt resistive element R1, the first control resistive element R1L, a second shunt transistor element 34, the second shunt resistive element R2, the first series transistor element 28, the second control resistive element R2L, a series resistive element RR, and a third control resistive element R3L.

The first series transistor element 28 is coupled in series in the signal path 16 between the first connection node 12 and the second connection node 14. In this regard, the first current-carrying terminal of the first series transistor element 28 is coupled to the first connection node 12 via the signal path 16. The second current-carrying terminal of the first series transistor element 28 is coupled to the second connection node 14 via the signal path 16.

In general, in one embodiment of the Pi attenuator circuit 32, the series resistive element RR is coupled across the first series transistor element 28. The first shunt resistive element R1 and the first shunt transistor element 22 are coupled in series between a first end of the series resistive element RR and ground. The second shunt resistive element R2 and the second shunt transistor element 34 are coupled between a second end of the series resistive element RR and ground.

In one embodiment of the Pi attenuator circuit 32, the series resistive element RR is coupled between the first current-carrying terminal of the first series transistor element 28 and the second current-carrying terminal of the first series transistor element 28. The first shunt resistive element R1 is coupled between the first shunt transistor element 22 and the first current-carrying terminal of the first series transistor element 28. The second shunt resistive element R2 is coupled between the second shunt transistor element 34 and the second current-carrying terminal of the first series transistor element 28.

The first control resistive element R1L is coupled to the control input to the first shunt transistor element 22. The second control resistive element R2L is coupled to a control input to the first series transistor element 28. The third control resistive element R3L is coupled to the control input to the second shunt transistor element 34. The first shunt transistor element 22 receives the first attenuation control signal FAC via the first control resistive element R1L. The first series transistor element 28 receives the second attenuation control signal SAC via the second control resistive element R2L. The second shunt transistor element 34 receives the third attenuation control signal TAC via the third control resistive element R3L.

In one embodiment of the first shunt transistor element 22, the first shunt transistor element 22 operates in one of the OFF state and the ON state based on the first attenuation control signal FAC. In an alternate embodiment of the Pi attenuator circuit 32 the first control resistive element R1L is omitted, such that the first shunt transistor element 22 receives the first attenuation control signal FAC directly.

In one embodiment of the second shunt transistor element 34, the second shunt transistor element 34 operates in one of the OFF state and the ON state based on the third attenuation control signal TAC. In an alternate embodiment of the Tee attenuator circuit 26, the third control resistive element R3L is omitted, such that the second shunt transistor element 34 receives the third attenuation control signal TAC directly.

In one embodiment of the first series transistor element 28, the first series transistor element 28 operates in one of the OFF state and the ON state based on the second attenuation control signal SAC. In another embodiment of the Tee attenuator circuit 26, the second control resistive element R2L is omitted, such that the first series transistor element 28 receives the second attenuation control signal SAC directly.

In one embodiment of the programmable RF attenuator 10, when the first shunt transistor element 22 and the second shunt transistor element 34 operate in the ON state, the first series transistor element 28 operates in the OFF state, such that the Tee attenuator circuit 26 provides at least a portion of the RF attenuation between the first connection node 12 and the second connection node 14. Specifically, the first shunt resistive element R1, the second shunt resistive element R2, and the series resistive element RR provide at least a portion of the RF attenuation between the first connection node 12 and the second connection node 14.

In one embodiment of the programmable RF attenuator 10, when the first shunt transistor element 22 and the second shunt transistor element 34 operate in the OFF state, the first series transistor element 28 operates in the ON state, such that the Pi attenuator circuit 32 contributes no significant RF attenuation between the first connection node 12 and the second connection node 14.

In one embodiment of the programmable RF attenuator 10, the programmable RF attenuator 10 provides variable attenuation, such that the first shunt transistor element 22 operates within a first analog operating region, the first series transistor element 28 operates within a second analog operating region, and the second shunt transistor element 34 operates within a third analog region. As such, the first attenuation control signal FAC is an analog control signal, which selects an operating point in the first analog operating region, the second attenuation control signal SAC is an analog control signal, which selects an operating point in the second analog operating region, and the third attenuation control signal TAC is an analog control signal, which selects an operating point in the third analog operating region.

Therefore, the first shunt transistor element 22, the first series transistor element 28, the second shunt transistor element 34, the first shunt resistive element R1, the second shunt resistive element R2, and the series resistive element RR provide at least a portion of the RF attenuation of the programmable RF attenuator 10. In one embodiment of the programmable RF attenuator 10, the programmable RF attenuator 10 receives the RF input signal RFN via the first connection node 12 and provides the RF output signal RFT via the second connection node 14 based on the RF input signal RFN and the RF attenuation.

In one embodiment of the second shunt transistor element 34, the second shunt transistor element 34 is a BJT element, such that the control input to the second shunt transistor element 34 is a base. In an alternate embodiment of the second shunt transistor element 34, the second shunt transistor element 34 is an FET element, such that the control input to the second shunt transistor element 34 is a gate. In another embodiment of the second shunt transistor element 34, the second shunt transistor element 34 is any type of transistor element.

Figure 6:
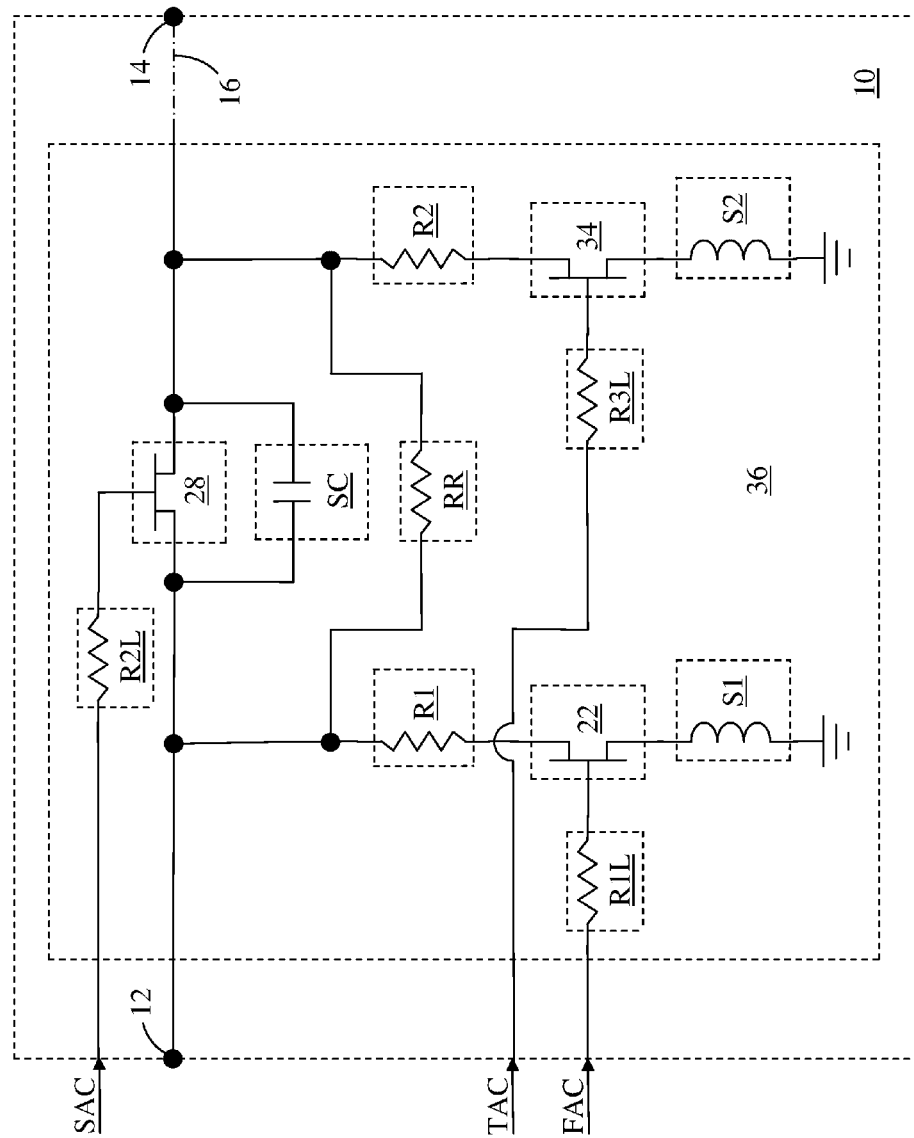
FIG. 6 shows details of the programmable RF attenuator according to one embodiment of the programmable RF attenuator.

FIG. 6 shows details of the programmable RF attenuator 10 according to one embodiment of the programmable RF attenuator 10. The programmable RF attenuator 10 illustrated in FIG. 6 includes a Pi attenuator circuit model 36 of the Pi attenuator circuit 32 illustrated in FIG. 5. The Pi attenuator circuit model 36 includes the first shunt transistor element 22, the first shunt resistive element R1, the first control resistive element R1L, the second shunt transistor element 34, the second shunt resistive element R2, the first series transistor element 28, the second control resistive element R2L, the series resistive element RR, the third control resistive element R3L, and further includes the first effective shunt inductance S1, a second effective shunt inductance S2, and the effective series capacitance SC.

In the Pi attenuator circuit model 36, the first shunt transistor element 22, the first shunt resistive element R1, and the first effective shunt inductance S1 are coupled in series between the first current-carrying terminal of the first series transistor element 28 and the ground. The second shunt transistor element 34, the second shunt resistive element R2, and the second effective shunt inductance S2 are coupled in series between the second current-carrying terminal of the first series transistor element 28 and the ground.

In one embodiment of the first series transistor element 28, the first series transistor element 28 provides the effective series capacitance SC across the first series capacitance element 28 The effective series capacitance SC may be as a result of construction geometries of the first series transistor element 28 that may introduce one or mode parallel capacitances across the first series transistor element 28. The effective series capacitance SC may result in RF leakage across the first series transistor element 28 when the first series transistor element 28 is in an OFF state.

In one embodiment of the Pi attenuator circuit model 36, the first effective shunt inductance S1, the second effective shunt inductance S1, or both are based on any or all electrically conductive paths through the Pi attenuator circuit 32 (FIG. 5), such as circuit traces, via connections, component leads, wires, internal component connections, the like, or any combination thereof. In one embodiment of the first series transistor element 28, the first series transistor element 28 provides the effective series capacitance SC across the first series transistor element 28. The first effective shunt inductance S1, the second effective shunt inductance S2, the effective series capacitance SC, or any combination thereof may contribute to the reactive characteristics of the programmable RF attenuator 10.

Figure 7:
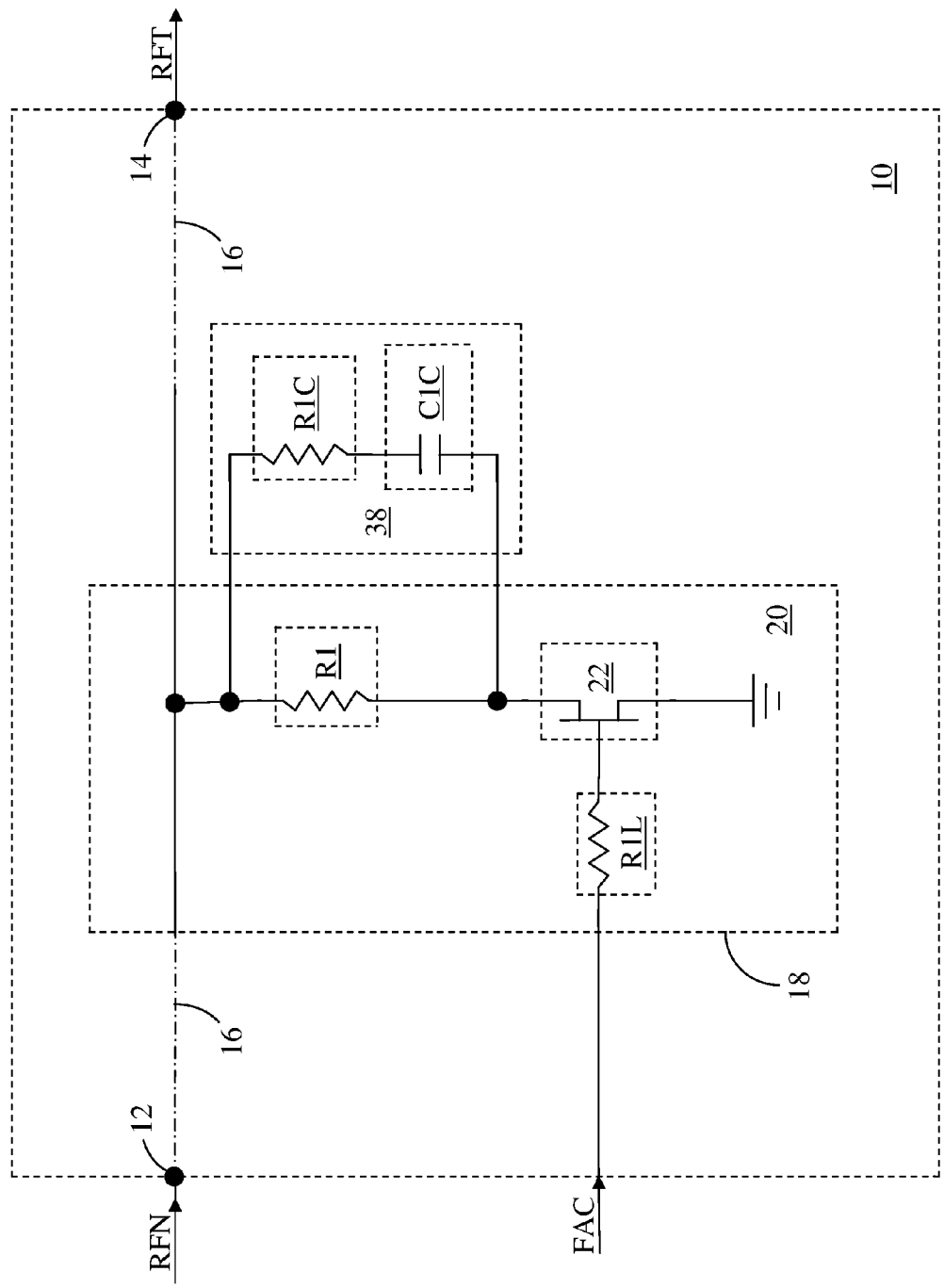
FIG. 7 shows details of the programmable RF attenuator according to a supplemental embodiment of the programmable RF attenuator.

FIG. 7 shows details of the programmable RF attenuator 10 according to a supplemental embodiment of the programmable RF attenuator 10. The programmable RF attenuator 10 illustrated in FIG. 7 is similar to the programmable RF attenuator 10 illustrated in FIG. 2, except the programmable RF attenuator 10 illustrated in FIG. 7 further includes a first reactance compensation circuit 38, which is coupled to the first RF attenuator circuit 18.

In one embodiment of the programmable RF attenuator 10, the first reactance compensation circuit 38 at least partially compensates for reactive characteristics of the programmable RF attenuator 10 that affect an attenuation flatness of the programmable RF attenuator 10. Such reactive characteristics may adversely affect the attenuation flatness of the programmable RF attenuator 10. In one embodiment of the programmable RF attenuator 10, the reactive characteristics include the first effective shunt inductance S1 (FIG. 2).

The first reactance compensation circuit 38 includes a first compensation resistive element R1C and a first compensation capacitive element C1C. In one embodiment of the first reactance compensation circuit 38, the first compensation resistive element R1C and the first compensation capacitive element C1C are coupled in series. In one embodiment of the programmable RF attenuator 10, the first reactance compensation circuit 38 is coupled across the first shunt resistive element R1. In one embodiment of the programmable RF attenuator 10, the first reactance compensation circuit 38 at least partially compensates for the first effective shunt inductance S1 (FIG. 2).

In one embodiment of the first attenuation control signal FAC, the first attenuation control signal FAC is a digital control signal. In one embodiment of the programmable RF attenuator 10, the first shunt transistor element 22 operates in one of an ON state and an OFF state based on the first attenuation control signal FAC. During the ON state, the first shunt resistive element R1 provides at least part of the RF attenuation of the programmable RF attenuator 10.

In an alternate embodiment of the first attenuation control signal FAC, the first attenuation control signal FAC is an analog control signal. In one embodiment of the programmable RF attenuator 10, the programmable RF attenuator 10 provides variable attenuation, such that the first shunt transistor element 22 operates within a first analog operating region. In one embodiment of the first attenuation control signal FAC, the first attenuation control signal FAC selects an operating point in the first analog operating region. As such, the first shunt resistive element R1 and the first shunt transistor element 22 provide at least part of the RF attenuation of the programmable RF attenuator 10.

Figure 8:
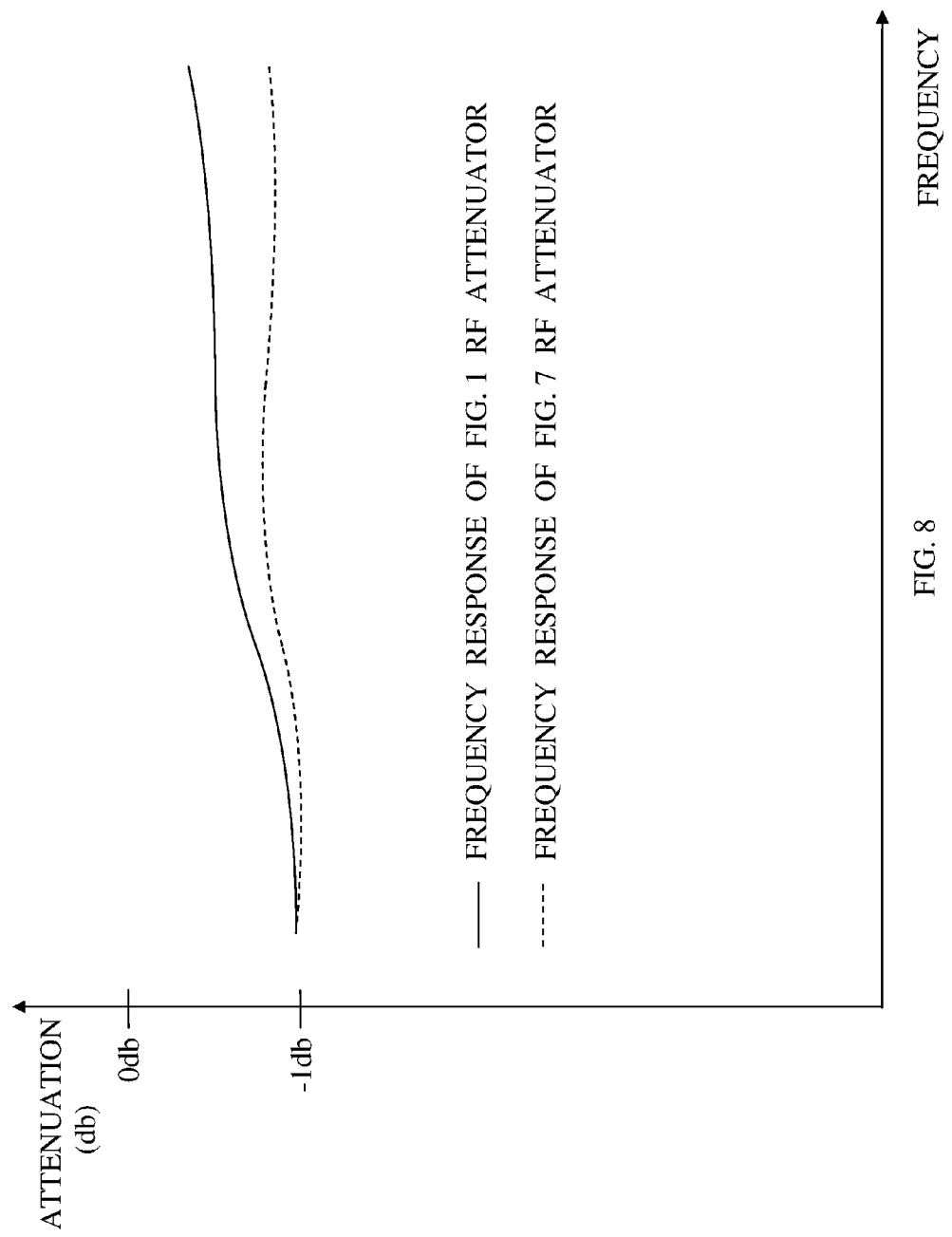
FIG. 8 is a graph illustrating a frequency response of the programmable RF attenuator illustrated in FIG. 1 and further illustrating a frequency response of the programmable RF attenuator illustrated in FIG. 7 according to embodiments of the programmable RF attenuator illustrated in FIGS. 1 and 7, respectively.

FIG. 8 is a graph illustrating a frequency response of the programmable RF attenuator 10 illustrated in FIG. 1 and further illustrating a frequency response of the programmable RF attenuator 10 illustrated in FIG. 7 according to embodiments of the programmable RF attenuator 10 illustrated in FIGS. 1 and 7, respectively. Ideally, an attenuation flatness of the programmable RF attenuator 10 would be such that the frequency response of the programmable RF attenuator 10 would be a completely flat straight line having a slope of zero over a frequency operating range of the programmable RF attenuator 10.

Since the programmable RF attenuator 10 illustrated in FIG. 1 is uncompensated, as frequency increases, the RF attenuation of the programmable RF attenuator 10 increases significantly. However, since the programmable RF attenuator 10 illustrated in FIG. 7 is frequency compensated, as the frequency increases, the RF attenuation of the programmable RF attenuator 10 stays relatively flat, such that the attenuation flatness of the programmable RF attenuator 10 is improved.

Figure 9:
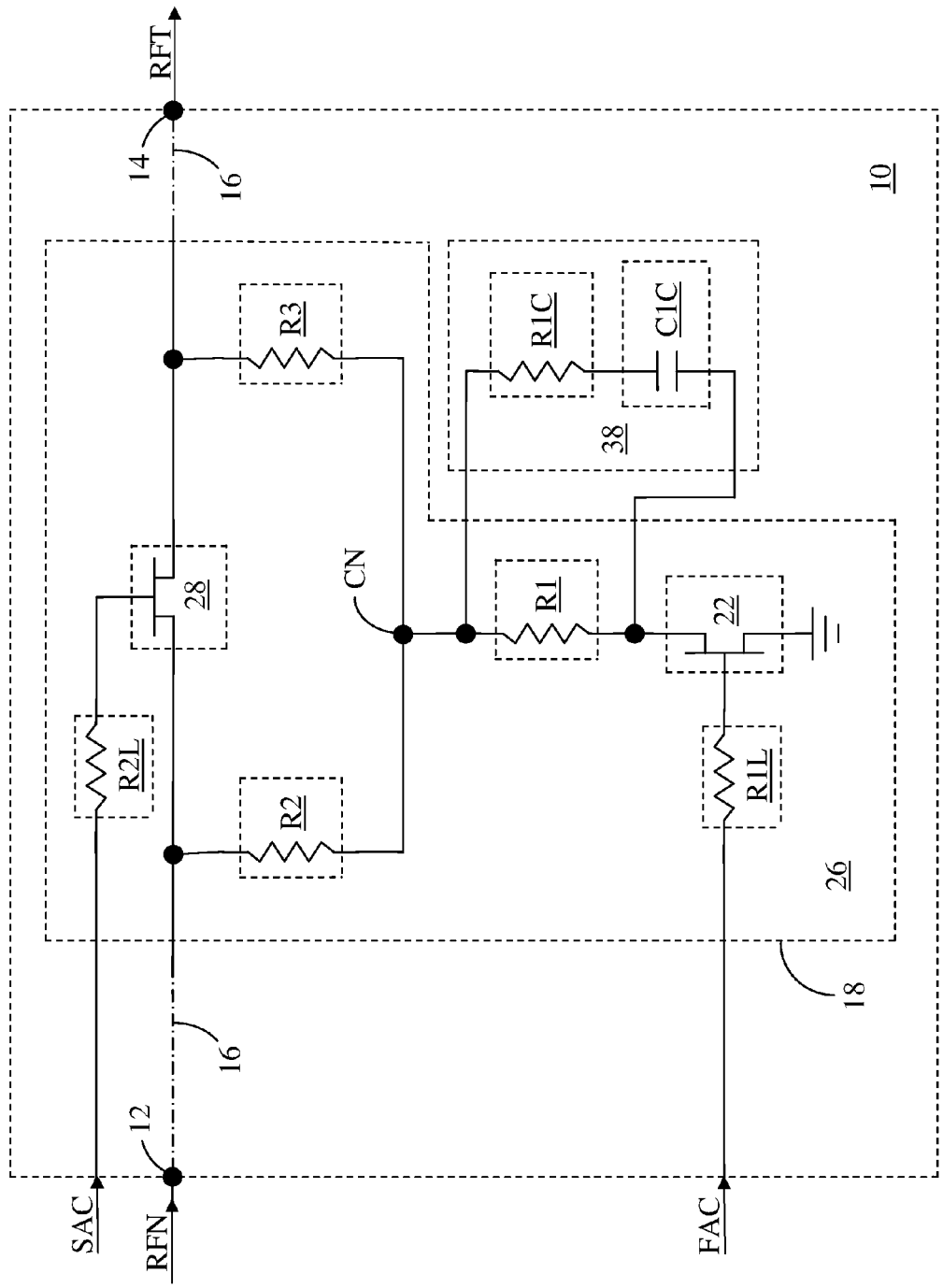
FIG. 9 shows details of the programmable RF attenuator according to one embodiment of the programmable RF attenuator.

FIG. 9 shows details of the programmable RF attenuator 10 according to one embodiment of the programmable RF attenuator 10. The programmable RF attenuator 10 illustrated in FIG. 9 is similar to the programmable RF attenuator 10 illustrated in FIG. 3, except the programmable RF attenuator 10 illustrated in FIG. 9 further includes a first reactance compensation circuit 38 coupled across the first shunt resistive element R1. In one embodiment of the first reactance compensation circuit 38, the first reactance compensation circuit 38 includes a first compensation resistive element R1C and a first compensation capacitive element C1C coupled in series. As such, the series combination of the first compensation resistive element R1C and the first compensation capacitive element C1C is coupled across the first shunt resistive element R1.

In one embodiment of the programmable RF attenuator 10, the programmable RF attenuator 10 includes all or part of the reactive characteristics described regarding the programmable RF attenuator 10 shown in FIG. 4. These reactive characteristics may include the effective series capacitance SC (FIG. 4), the first effective shunt inductance S1 (FIG. 4), or both. In one embodiment of the first reactance compensation circuit 38, the first reactance compensation circuit 38 at least partially compensates for the effective series capacitance SC (FIG. 4), the first effective shunt inductance S1 (FIG. 4), or both.

Figure 10:
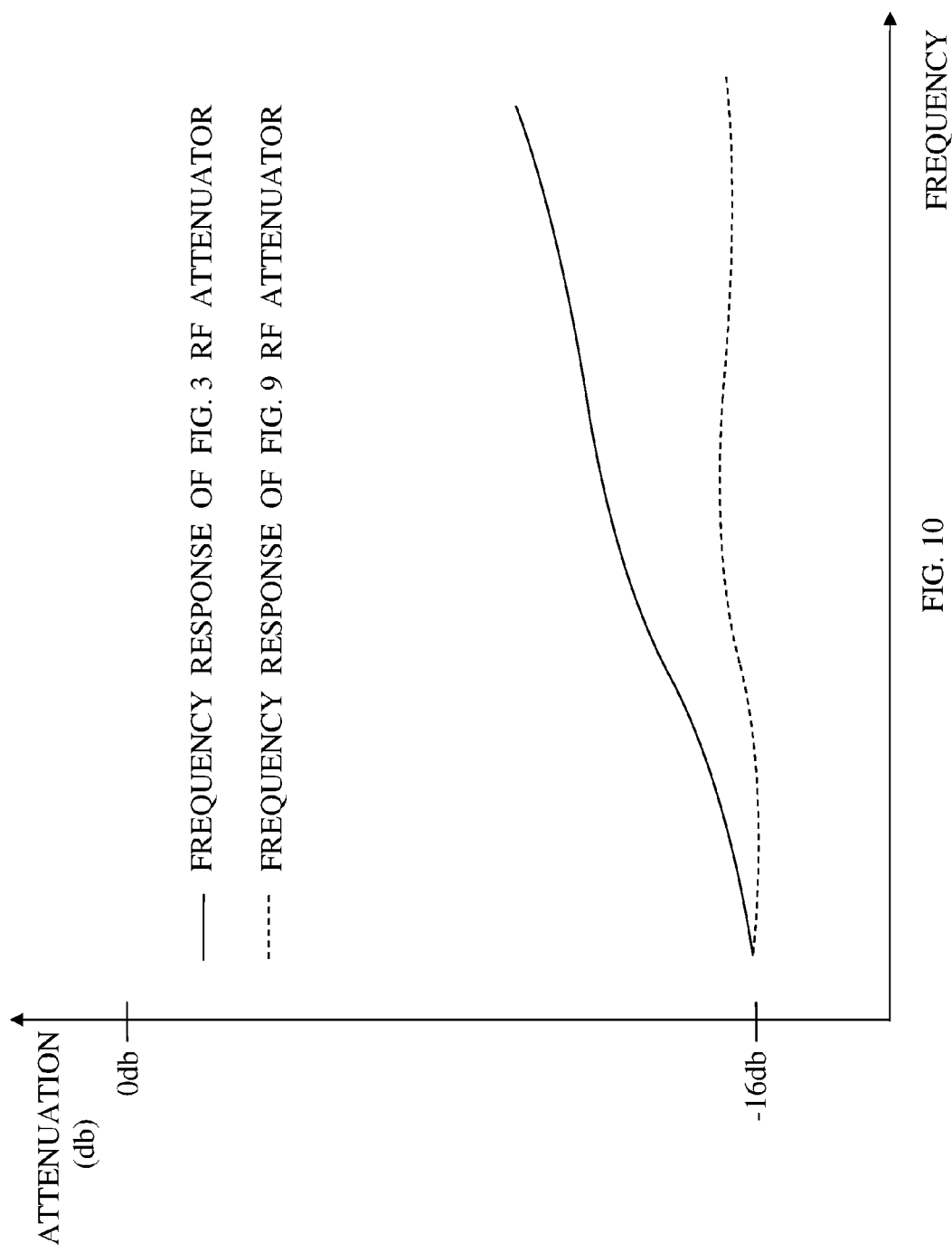
FIG. 10 is a graph illustrating a frequency response of the programmable RF attenuator illustrated in FIG. 3 and further illustrating a frequency response of the programmable RF attenuator illustrated in FIG. 9 according to embodiments of the programmable RF attenuator illustrated in FIGS. 3 and 9, respectively.

FIG. 10 is a graph illustrating a frequency response of the programmable RF attenuator 10 illustrated in FIG. 3 and further illustrating a frequency response of the programmable RF attenuator 10 illustrated in FIG. 9 according to embodiments of the programmable RF attenuator 10 illustrated in FIGS. 3 and 9, respectively.

Since the programmable RF attenuator 10 illustrated in FIG. 3 is uncompensated, as frequency increases, the RF attenuation of the programmable RF attenuator 10 increases significantly. However, since the programmable RF attenuator 10 illustrated in FIG. 9 is frequency compensated, as the frequency increases, the RF attenuation of the programmable RF attenuator 10 stays relatively flat, such that the attenuation flatness of the programmable RF attenuator 10 is improved.

Figure 11:
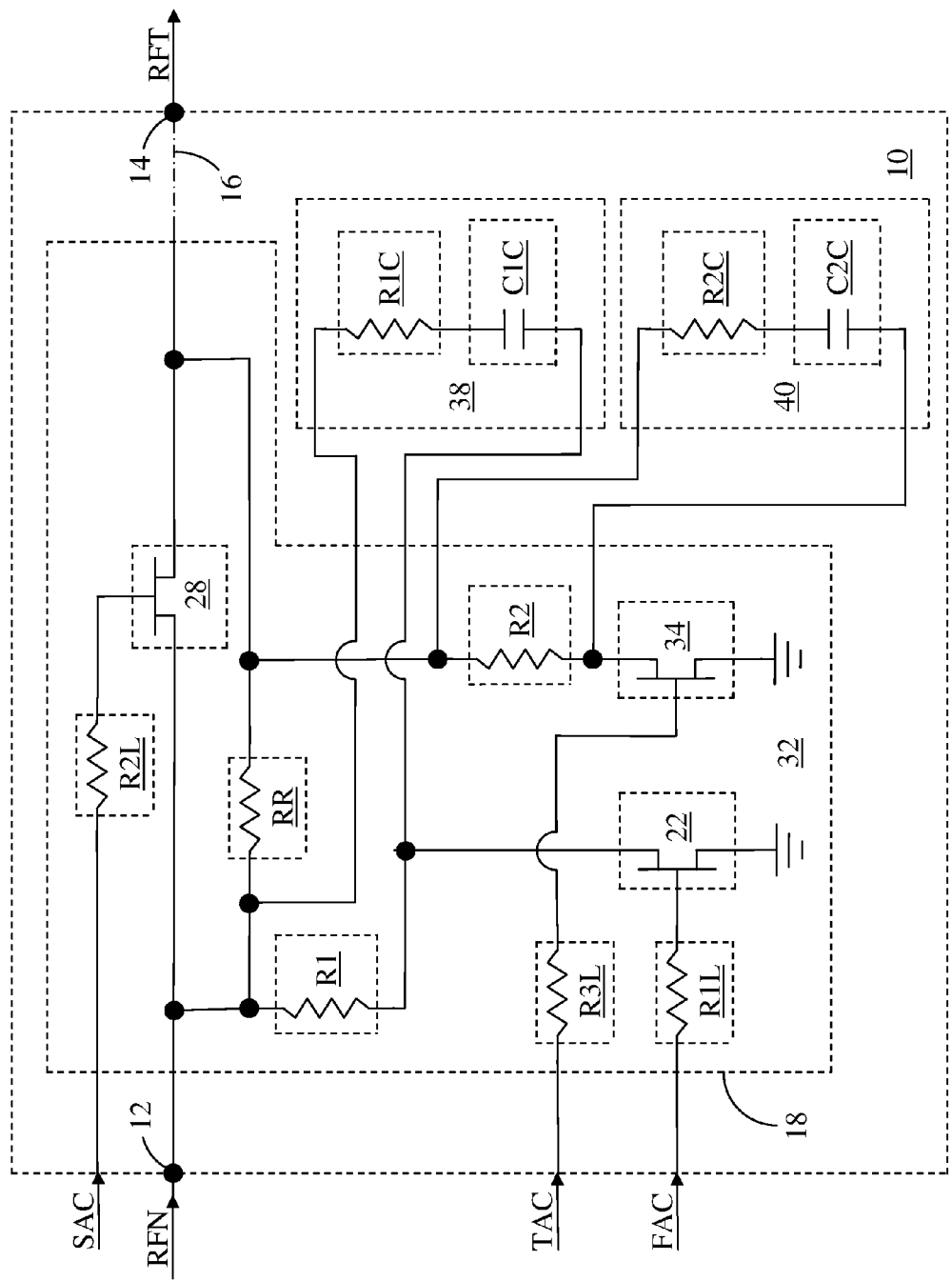
FIG. 11 shows details of the programmable RF attenuator according to an additional embodiment of the programmable RF attenuator.

FIG. 11 shows details of the programmable RF attenuator 10 according to an additional embodiment of the programmable RF attenuator 10. The programmable RF attenuator 10 illustrated in FIG. 11 is similar to the programmable RF attenuator 10 illustrated in FIG. 5, except the programmable RF attenuator 10 illustrated in FIG. 11 further includes the first reactance compensation circuit 38 coupled across the first shunt resistive element R1 and a second reactance compensation circuit 40 coupled across the second shunt resistive element R2.

In one embodiment of the first reactance compensation circuit 38, the first reactance compensation circuit 38 includes the first compensation resistive element R1C and the first compensation capacitive element C1C coupled in series. As such, the series combination of the first compensation resistive element R1C and the first compensation capacitive element C1C is coupled across the first shunt resistive element R1.

In one embodiment of the second reactance compensation circuit 40, the second reactance compensation circuit 40 includes a second compensation resistive element R2C and a second compensation capacitive element C2C coupled in series. As such, the series combination of the second compensation resistive element R2C and the second compensation capacitive element C2C is coupled across the second shunt resistive element R2.

In one embodiment of the programmable RF attenuator 10, the programmable RF attenuator 10 includes all or part of the reactive characteristics described regarding the programmable RF attenuator 10 shown in FIG. 6. These reactive characteristics may include the effective series capacitance SC (FIG. 6), the first effective shunt inductance S1 (FIG. 6), the second effective shunt inductance S2 (FIG. 6), or any combination thereof.

In this regard, in one embodiment of the programmable RF attenuator 10, the first reactance compensation circuit 38 at least partially compensates for the reactive characteristics of the programmable RF attenuator 10 shown in FIG. 6. In one embodiment of the programmable RF attenuator 10, the first reactance compensation circuit 38 at least partially compensates for the reactive characteristics of the programmable RF attenuator 10 shown in FIG. 6 and the second reactance compensation circuit 40 at least partially further compensates for the reactive characteristics of the programmable RF attenuator 10 shown in FIG. 6.

In one embodiment of the first reactance compensation circuit 38, the first reactance compensation circuit 38 at least partially compensates for the effective series capacitance SC (FIG. 6), the first effective shunt inductance S1 (FIG. 6), or both. In one embodiment of the second reactance compensation circuit 40, the second reactance compensation circuit 40 at least partially compensates for the effective series capacitance SC (FIG. 6), the second effective shunt inductance S2 (FIG. 6), or both.

Figure 12:
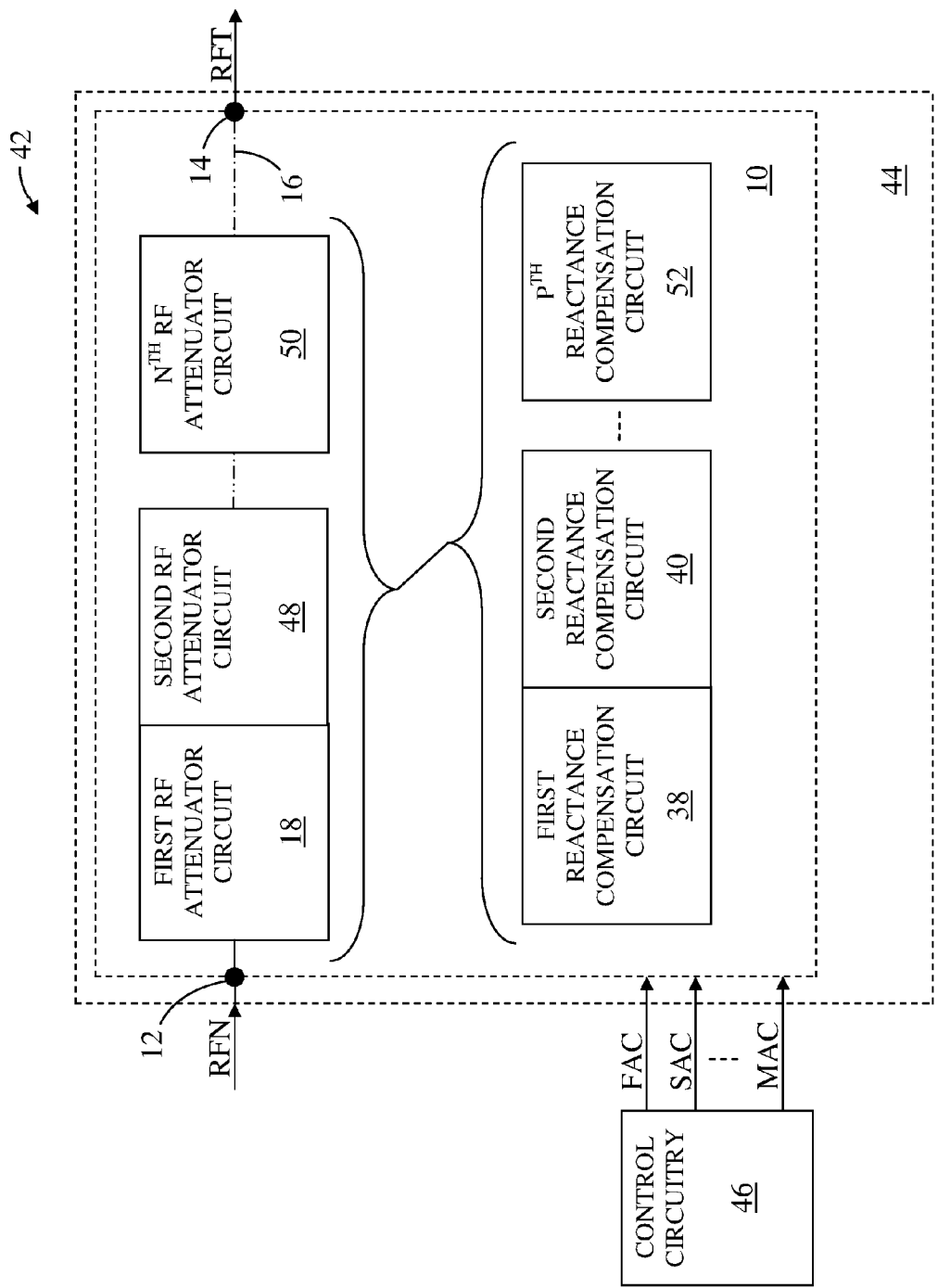
FIG. 12 shows details of RF circuitry according to one embodiment of the RF circuitry.

FIG. 12 shows details of RF circuitry 42 according to one embodiment of the RF circuitry 42. The RF circuitry 42 includes a monolithic microwave integrated circuit (MMIC) 44 and control circuitry 46. In one embodiment of the MMIC 44, the MMIC 44 includes the programmable RF attenuator 10. In one embodiment of the control circuitry 46, the control circuitry 46 provides the first attenuation control signal FAC, the second attenuation control signal SAC, and up to and including an $M^{TH}$ attenuation control signal MAC to the programmable RF attenuator 10. In general, the control circuitry 46 provides a group of attenuation control signals FAC, SAC, MAC to the first RF attenuator circuit 18. As such, in one embodiment of the control circuitry 46, the control circuitry 46 selects a magnitude of the RF attenuation of the programmable RF attenuator 10 using any or all of the group of attenuation control signals FAC, SAC, MAC.

In one embodiment of the RF circuitry 42, the RF circuitry 42 includes the programmable RF attenuator 10. The programmable RF attenuator 10 includes the first RF attenuator circuit 18, a second RF attenuator circuit 48, and up to and including an $N^{TH}$ RF attenuator circuit 50. In general, the programmable RF attenuator 10 includes a group of RF attenuator circuits 18, 48, 50. The programmable RF attenuator 10 further includes the first reactance compensation circuit 38, the second reactance compensation circuit 40, and up to and including a $P^{TH}$ reactance compensation circuit 52. In general, the programmable RF attenuator 10 includes a group of reactance compensation circuits 30, 40, 52.

The group of RF attenuator circuits 18, 48, 50 is coupled in series between the first connection node 12 and the second connection node 14 via the signal path 16. The group of reactance compensation circuits 30, 40, 52 is coupled to the group of RF attenuator circuits 18, 48, 50, such that each of the group of reactance compensation circuits 30, 40, 52 at least partially compensates for reactive characteristics of the programmable RF attenuator 10 that affect flatness of the programmable RF attenuator 10.

Figure 13:
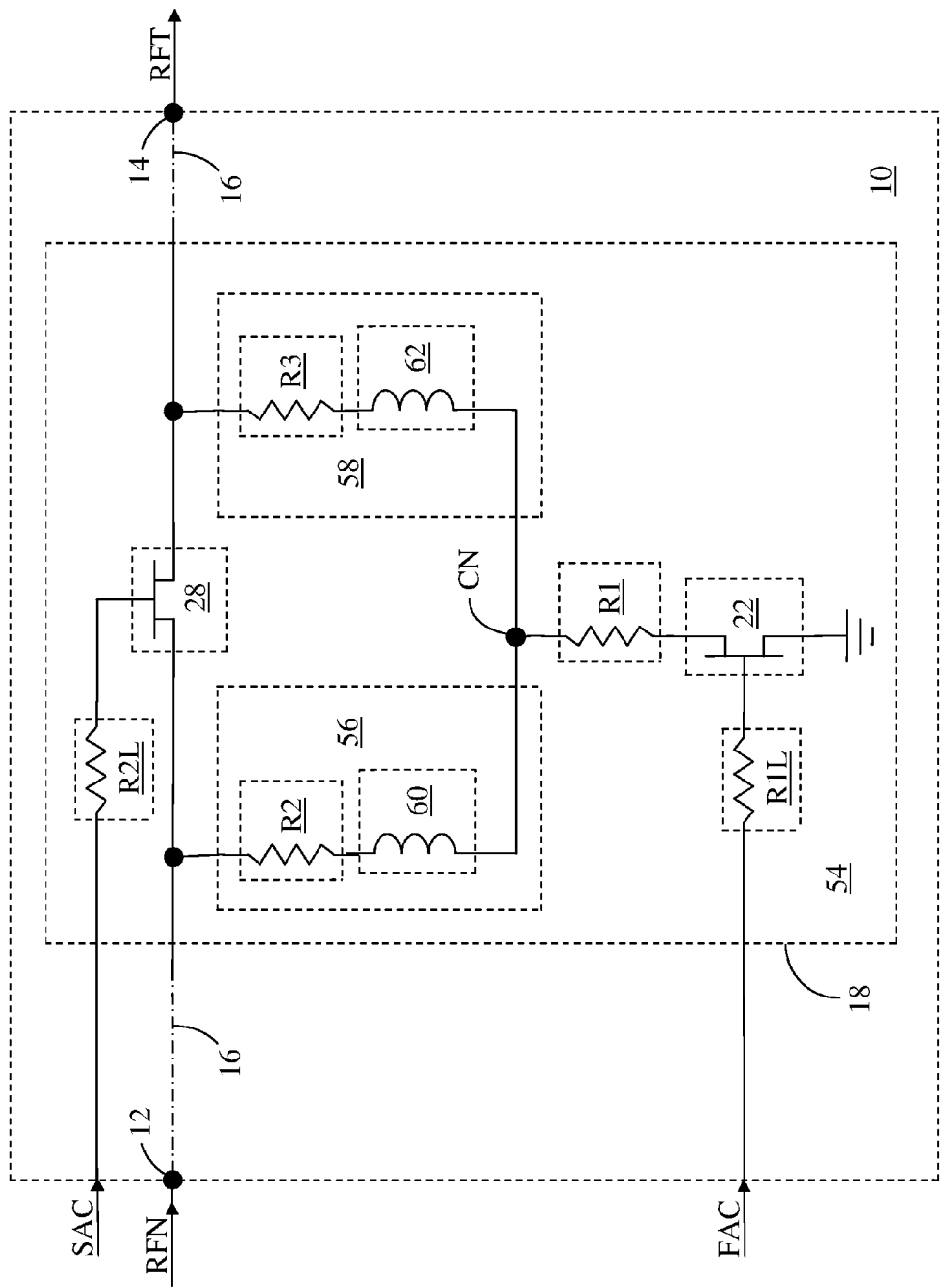
FIG. 13 shows details of the programmable RF attenuator according to one embodiment of the programmable RF attenuator.

FIG. 13 shows details of the programmable RF attenuator 10 according to one embodiment of the programmable RF attenuator 10. The programmable RF attenuator 10 illustrated in FIG. 13 is similar to the programmable RF attenuator 10 illustrated in FIG. 3, except in the programmable RF attenuator 10 illustrated in FIG. 13, the Tee attenuator circuit 26 is replaced with a reactance-compensated Tee attenuator circuit 54.

The reactance-compensated Tee attenuator circuit 54 is similar to the Tee attenuator circuit 26, except in the reactance-compensated Tee attenuator circuit 54, the second shunt resistive element R2 is replaced with a first compensation-attenuation circuit 56 and the third shunt resistive element R3 is replaced with a second compensation-attenuation circuit 58. Therefore, the first compensation-attenuation circuit 56 is coupled between the connection node CN and the first current-carrying terminal of the first series transistor element 28. The second compensation-attenuation circuit 58 is coupled between the connection node CN and the second current-carrying terminal of the first series transistor element 28.

In this regard, the first compensation-attenuation circuit 56 includes a first inductive element 60 and the second shunt resistive element R2 coupled in series between the first current-carrying terminal of the first series transistor element 28 and the connection node CN. The second compensation-attenuation circuit 58 includes a second inductive element 62 and the third shunt resistive element R3 coupled in series between the second current-carrying terminal of the first series transistor element 28 and the connection node CN.

In one embodiment of the reactance-compensated Tee attenuator circuit 54, the reactance-compensated Tee attenuator circuit 54 provides RF attenuation between the first connection node 12 and the second connection node 14. In general, the first series transistor element 28 is coupled between the first connection node 12 and the second connection node 14 via the signal path 16. In general, the first compensation-attenuation circuit 56 is coupled between the first current-carrying terminal of the first series transistor element 28 and the ground; and provides part of the RF attenuation and partially compensates for the effective series capacitance SC (FIG. 4) of the first series transistor element 28. Additionally, the second compensation-attenuation circuit 58 is coupled between the second current-carrying terminal of the first series transistor element 28 and the ground; and provides part of the RF attenuation and partially compensates for the effective series capacitance SC (FIG. 4) of the first series transistor element 28.

Those skilled in the art will recognize improvements and modifications to the preferred embodiments of the present disclosure. All such improvements and modifications are considered within the scope of the concepts disclosed herein and the claims that follow.

What is claimed is:

1. A programmable RF attenuator having a first connection node and a second connection node, and comprising:
   a first RF attenuator circuit comprising a first shunt transistor element and a first shunt resistive element, which is coupled to the first shunt transistor element, wherein the first shunt transistor element is configured to receive a first attenuation control signal; and
   a first reactance compensation circuit coupled across the first shunt resistive element and configured to at least partially compensate for reactive characteristics of the programmable RF attenuator that affect an attenuation flatness of the programmable RF attenuator, wherein the programmable RF attenuator is configured to provide RF attenuation between the first connection node and the second connection node based on at least the first attenuation control signal.

2. The programmable RF attenuator of claim 1 wherein the first reactance compensation circuit comprises a first compensation resistive element and a first compensation capacitive element, such that the first compensation resistive element and the first compensation capacitive element are coupled in series.

3. The programmable RF attenuator of claim 2 wherein the first RF attenuator circuit is a shunt attenuator circuit, wherein the first reactance compensation circuit is further configured to at least partially compensate for an effective shunt inductance of the first RF attenuator circuit, such that the reactive characteristics of the programmable RF attenuator comprise the effective shunt inductance.

4. The programmable RF attenuator of claim 1 wherein the first shunt transistor element is configured to operate in one of an ON state and an OFF state based on the first attenuation control signal, such that during the ON state, the first shunt resistive element is configured to provide at least part of the RF attenuation.

5. The programmable RF attenuator of claim 1 wherein the first RF attenuator circuit further comprises a first series transistor element coupled between the first connection node and the second connection node, such that the first series transistor element is configured to receive a second attenuation control signal.

6. The programmable RF attenuator of claim 5 wherein the first reactance compensation circuit is further configured to at least partially compensate for an effective series capacitance of the first series transistor element, such that the reactive characteristics of the programmable RF attenuator comprise the effective series capacitance.

7. The programmable RF attenuator of claim 5 wherein the first series transistor element is configured to operate in one of an ON state and an OFF state based on the second attenuation control signal, such that during the OFF state, the first shunt resistive element is configured to provide at least part of the RF attenuation.

8. The programmable RF attenuator of claim 5 wherein the first RF attenuator circuit further comprises a second shunt resistive element and a third shunt resistive element; such that the second shunt resistive element is coupled between the first shunt resistive element and a first current-carrying terminal of the first series transistor element, and the third shunt resistive element is coupled between the first shunt resistive element and a second current-carrying terminal of the first series transistor element.

9. The programmable RF attenuator of claim 5 wherein the first RF attenuator circuit is a Tee attenuator circuit, wherein the first reactance compensation circuit is further configured to at least partially compensate for an effective shunt inductance of the first RF attenuator circuit and at least partially compensate for an effective series capacitance of the first series transistor element, such that the reactive characteristics of the programmable RF attenuator comprise the effective shunt inductance and the effective series capacitance.

10. The programmable RF attenuator of claim 5 wherein the first RF attenuator circuit further comprises a second shunt resistive element and a second shunt transistor element; such that the first shunt resistive element is coupled between the first shunt transistor element and a first current-carrying terminal of the first series transistor element, and the second shunt resistive element is coupled between the second shunt transistor element and a second current-carrying terminal of the first series transistor element.

11. The programmable RF attenuator of claim 10 further comprising a second reactance compensation circuit configured to at least partially further compensate for the reactive characteristics of the programmable RF attenuator, wherein the second reactance compensation circuit is coupled across the second shunt resistive element.

12. The programmable RF attenuator of claim 11 wherein the first RF attenuator circuit is a Pi attenuator circuit, wherein the first reactance compensation circuit is further configured to at least partially compensate for a first effective shunt inductance of the first RF attenuator circuit and the second reactance compensation circuit is configured to at least partially compensate for a second effective shunt inductance of the first RF attenuator circuit.

13. The programmable RF attenuator of claim 1 further comprising a plurality of RF attenuator circuits and a plurality of reactance compensation circuits, wherein the plurality of RF attenuator circuits is coupled in series between the first connection node and the second connection node; the plurality of RF attenuator circuits comprises the first RF attenuator circuit; the plurality of reactance compensation circuits comprises the first reactance compensation circuit; and each of the plurality of reactance compensation circuits is configured to at least partially compensate for the reactive characteristics of the programmable RF attenuator that affect the attenuation flatness of the programmable RF attenuator.

14. The programmable RF attenuator of claim 1 further configured to provide variable attenuation, wherein:
the first shunt transistor element is configured to operate within a first analog operating region;
the first attenuation control signal is an analog control signal configured to select an operating point in the first analog operating region; and
the first shunt transistor element and the first shunt resistive element are configured to provide at least part of the RF attenuation.

15. The programmable RF attenuator of claim 14 wherein:
the first RF attenuator circuit further comprises a first series transistor element coupled in series between the first connection node and the second connection node;
the first series transistor element is coupled to the first shunt transistor element and is configured to receive a second attenuation control signal;
the first series transistor element is configured to operate within a second analog operating region;
the second attenuation control signal is an analog control signal configured to select an operating point in the second analog operating region; and
the first shunt transistor element, the first shunt resistive element, and the first series transistor element are configured to provide at least a part of the RF attenuation.

16. The programmable RF attenuator of claim 1 configured to:
receive an RF input signal via the first connection node; and
provide an RF output signal via the second connection node based on the RF input signal and the RF attenuation.

17. The programmable RF attenuator of claim 16 wherein control circuitry is configured to provide at least the first attenuation control signal to select a magnitude of the RF attenuation.

18. The programmable RF attenuator of claim 16 wherein a frequency of the RF input signal is between 10 Megahertz and 40 Gigahertz.

19. The programmable RF attenuator of claim 1 wherein a monolithic microwave integrated circuit (MMIC) comprises the programmable RF attenuator.

* * * * *